United States Patent
Kirsch et al.

(10) Patent No.: US 11,888,372 B2
(45) Date of Patent: Jan. 30, 2024

(54) OPERATING UNIT FOR A VEHICLE

(71) Applicant: BEHR-HELLA THERMOCONTROL GMBH, Lippstadt (DE)

(72) Inventors: Stefan Kirsch, Lippstadt (DE); Pasi Kemppinen, Lippstadt (DE)

(73) Assignee: BEHR-HELLA THERMOCONTROL GMBH, Lippstadt (DE)

( * ) Notice: Subject to any disclaimer, the term of this patent is extended or adjusted under 35 U.S.C. 154(b) by 246 days.

(21) Appl. No.: 17/435,871

(22) PCT Filed: Feb. 13, 2020

(86) PCT No.: PCT/EP2020/053726
§ 371 (c)(1),
(2) Date: Sep. 2, 2021

(87) PCT Pub. No.: WO2020/182405
PCT Pub. Date: Sep. 17, 2020

(65) Prior Publication Data
US 2022/0149712 A1    May 12, 2022

(30) Foreign Application Priority Data

Mar. 13, 2019 (DE) .................... 10 2019 106 441.4
Apr. 12, 2019 (DE) .................... 10 2019 109 785.1

(51) Int. Cl.
*H02K 35/00* (2006.01)
*G06F 3/039* (2013.01)
*G06F 3/041* (2006.01)

(52) U.S. Cl.
CPC ........... *H02K 35/00* (2013.01); *G06F 3/0393* (2019.05); *G06F 3/0414* (2013.01)

(58) Field of Classification Search
CPC ...... G06F 3/016; G06F 3/0393; G06F 3/0414; H02K 35/00; H03K 17/96; H03K 2217/96062
See application file for complete search history.

(56) References Cited

U.S. PATENT DOCUMENTS

| 2013/0201127 A1 | 8/2013 | Abe et al. | |
| 2018/0242087 A1* | 8/2018 | Miyoshi | ............... H04R 17/005 |
| 2021/0339680 A1* | 11/2021 | Lundy | ................. H10N 30/802 |

FOREIGN PATENT DOCUMENTS

| DE | 10 2007 058 110 B4 | 1/2010 |
| DE | 10 2013 007 962 A1 | 11/2014 |

(Continued)

OTHER PUBLICATIONS

International Search Report (PCT/ISA/210) issued in PCT Application No. PCT/EP2020/053726 dated May 26, 2020 with English Translation.

(Continued)

*Primary Examiner* — Kenneth Bukowski
(74) *Attorney, Agent, or Firm* — BakerHostetler

(57) ABSTRACT

The operating unit for a vehicle is provided with a housing and an operating element elastically mounted in and/or on the housing, wherein the elastically mounted operating element forms a spring-mass system having a construction-related resonance frequency. The operating unit is further provided with an actuator for pulse-shaped mechanical excitation of the operating element, and a control unit for controlling the actuator when manually actuating the operating element. The resonance frequency is, due to construction, above the highest cut-off frequency that can typically still be detected by receptors for haptic feedback and/or for tactile sensation of a person. The frequency spectrum of the mechanical pulse at the resonance frequency and/or at one of the harmonics of the resonance frequency has no frequency (Continued)

components in that the power density spectrum above the cut-off frequency is energy-free or substantially energy-free.

6 Claims, 2 Drawing Sheets

(56) References Cited

FOREIGN PATENT DOCUMENTS

DE  10 2014 019 162 A1  6/2016
EP  2 348 384 A2  7/2011

OTHER PUBLICATIONS

Written Opinion (PCT/ISA/237) issued in PCT Application No. PCT/EP2020/053726 dated May 26, 2020.

* cited by examiner

OPERATING UNIT FOR A VEHICLE

The present application claims priority of the two national German Patent Applications 10 2019 106 441.4 of Mar. 13, 2019 and 10 2019 109 785.1 of Apr. 12, 2019, the contents of which are hereby incorporated by reference into the subject matter of the present patent application.

The invention relates to an operating unit for a vehicle with oscillation-free haptic feedback.

Systems for haptic feedback typically consist of an actuator that applies a force and a mechanical system on which the force acts. The resulting motion can be sensed by the user.

To allow this motion in the first place, the mechanical system is usually spring-mounted. Mechanical spring-mass systems inevitably have resonance frequencies with which they can oscillate.

There are haptic feedback approaches in which one of these resonance frequencies is deliberately stimulated in order to make the resulting sinusoidal vibration perceptible. The disadvantage of this approach is an impression that is usually described as qualitatively inferior or vague.

Figure 1:
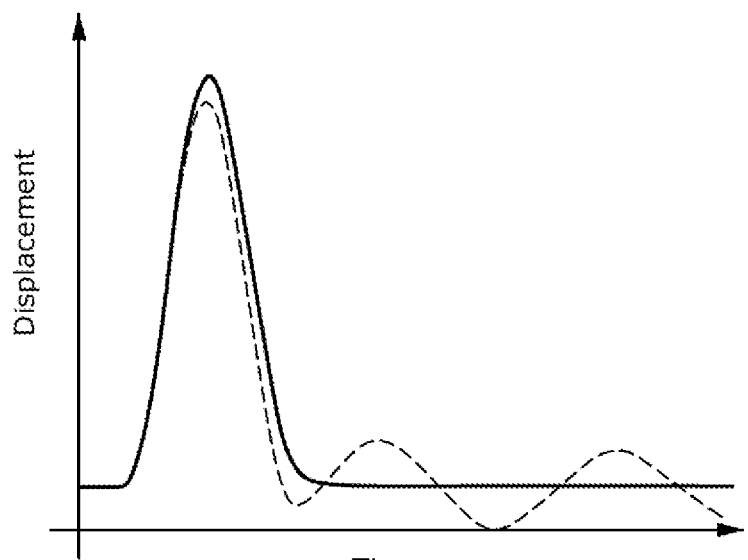

Therefore, a pulse-shaped course of path of the mechanical system is preferred (see the solid line in the diagram of FIG. 1).

Figure 2:
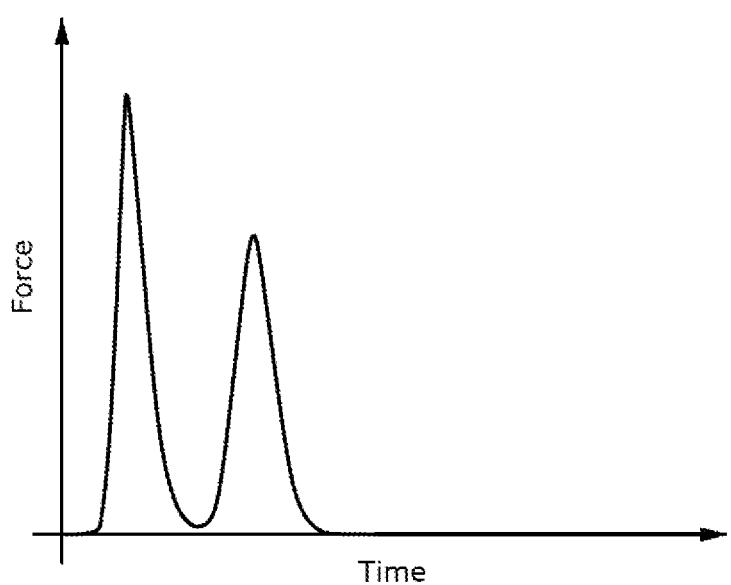

To achieve this motion profile, a force excitation adapted to the resonance frequencies of the system is required, which in principle typically looks like in the diagram of FIG. 2. The distance between the two maxima must be exactly adapted to the frequency of the oscillation to be suppressed. Otherwise, this oscillation will occur in the form of post-oscillations after the actual pulse (see the dashed line in the diagram of FIG. 1). This post-oscillation noticeably reduces the quality of the haptic feedback and must therefore be avoided.

It is known to try to bring the oscillating haptic feedback system to a standstill by controlling the drive (actuator) in the form of a pulse at a certain point in time (see e.g. DE-A-10 2013 007 962, DE-A-10 2014 019 162, DE-B-10 2007 058 110 and EP-A-2 348 384).

An object of the invention is to provide an operating unit with substantially oscillation-free haptic feedback.

This object is achieved with the invention proposing an operating unit for a vehicle, provided with
- a housing,
- an operating element elastically mounted in and/or on the housing,
- wherein the elastically mounted operating element forms a spring-mass system having a construction-related resonance frequency,
- an actuator for pulse-shaped mechanical excitation of the operating element, and
- a control unit for controlling the actuator when manually actuating the operating element,
- wherein the resonance frequency is, due to construction, above the highest cut-off frequency that can typically still be detected by receptors for haptic feedback and/or for tactile sensation of a person, and
- wherein the frequency spectrum of the mechanical pulse at the resonance frequency and/or at one of the harmonics of the resonance frequency has no frequency components in that the power density spectrum above the cut-off frequency is energy-free or substantially energy-free.

According to the invention, the spring-mass system is configured such that its resonance frequency is outside the frequency band within with a person is sensitive for tactile sensation, i.e. for "sensing" mechanical vibrations. Typically, the cut-off frequency that can still be detected by the skin receptors for haptic feedback and/or for tactile sensation of a person lies at a few 100 Hz, for example 500 Hz or 400 Hz or the like. According to the invention, the frequency spectrum of the mechanical pulse at the (first) resonance frequency (resonance base frequency) and/or at one of the harmonics of the resonance frequency does not have frequency components. This is expressed, for example, by the fact that the power density spectrum above the cut-off frequency is energy-free or substantially energy-free. This means that there is no excitation of the spring-mass system at the resonance frequency.

As already described above, the cut-off frequency can be 300 Hz or 250 Hz or 200 Hz.

In a further expedient embodiment of the invention, the resonance frequency according to the following formula can be defined by selecting the mass and/or spring constant of the spring-mass system:

$$f = \frac{1}{2\pi}\sqrt{\frac{k}{m}},$$

wherein m describes the mass of the spring-mass system, k describes the spring constant of the spring-mass system and f describes the resonance frequencies.

In a typical implementation of the operating unit, said operating unit is a touchpad or a touchscreen with a touch-sensitive surface.

Typically, it is provided that the operating unit is configured to detect a valid actuation as a function of the actuation pressure or actuation force or the course of the actuation pressure or actuation force.

In a further expedient embodiment of the invention, the actuator can be designed as a tension rod magnet, as a plunger coil drive or as a piezo drive.

In the following the invention is further described with reference to the drawings. The drawings show different diagrams which were already discussed above and will be discussed below.

As described above, the mass-spring system has resonance frequencies with which it oscillates, provided that it is excited accordingly. The receptors for haptic sensation in the finger predominantly respond to frequencies below a cut-off frequency of e.g. 200 Hz. If the mechanical system can be designed such that its resonance frequencies are all above this threshold, e.g. 200 Hz, then a haptically well perceptible pulse can be generated which cannot post-oscillate at all.

The first resonance frequency of a mass-spring system follows the equation $$f = \frac{1}{2\pi}\sqrt{\frac{k}{m}}.$$

Thus, by selecting the magnitude of the mass m and the spring rate k the position of the first resonance frequency in the spectrum can be estimated and actively influenced.

Figure 3:
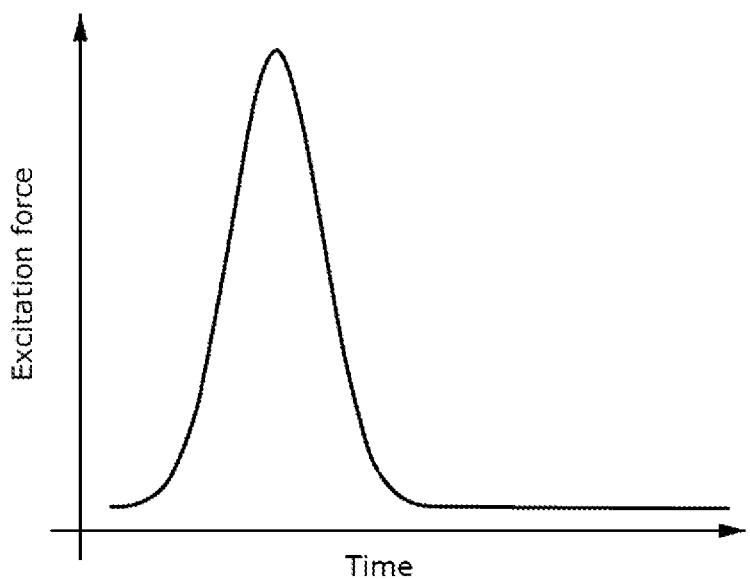

Furthermore, the frequency spectrum of the excitation signal is influenced in such a way that no resonance frequencies are excited, but a pulse perceptible by the finger is still evoked. As a result of an exemplary selection of the excitation signal, reference is made to the curve shown in FIG. 3, which has the power density spectrum shown in FIG.

Figure 4:
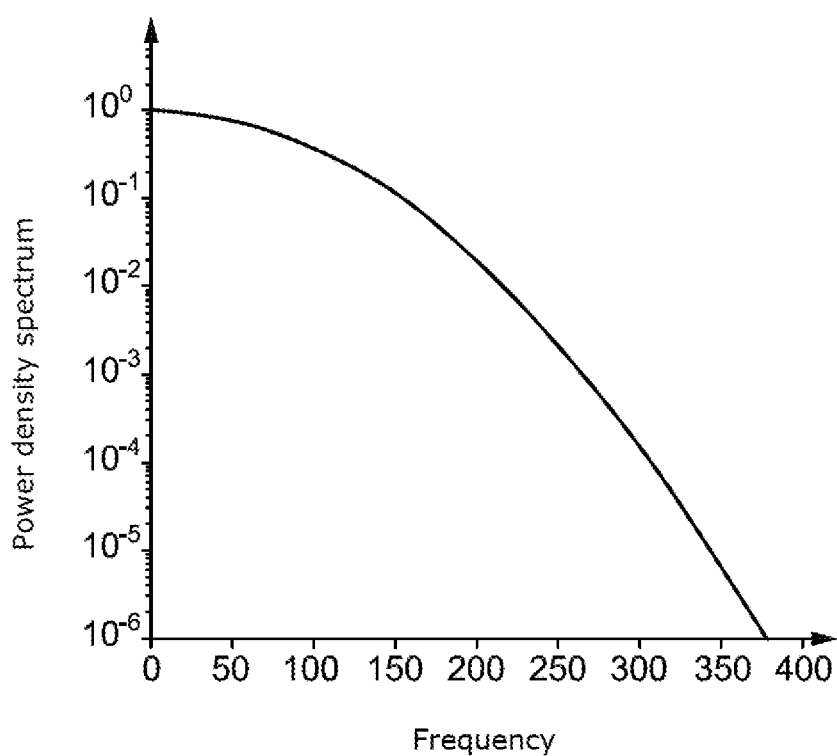

4. The logarithmic scale of the diagram of FIG. 4 clearly shows that the (normalized) energy decreases drastically with increasing frequency, so that above a threshold, e.g. 200 Hz, no more natural oscillations are excited to any appreciable extent, thus achieving the object.

It should be noted that the system behavior according to the invention has nothing to do with damping. The principle on which the invention is based is therefore rather "What is not excited does not have to be braked". This means that a so-called braking pulse is not even necessary. Instead, the deflection directly follows the exciting force.

The novelty and advantage of the present invention is the combination of an excitation signal, especially its spectral components, and a mechanical design that allows oscillations only outside the excited frequency spectrum.

BIBLIOGRAPHY

1. DE-A-10 2013 007 962
2. DE-A-10 2014 019 162
3. DE-B-10 2007 058 110
4. EP-A-2 348 384

The invention claimed is:

1. An operating unit for a vehicle, comprising:
a housing,
an operating element elastically mounted in or on the housing,
wherein the elastically mounted operating element forms a spring-mass system having a construction-related resonance frequency,
an actuator for pulse-shaped mechanical excitation of the operating element, the actuator operable to be controlled
when manually actuating the operating element,
wherein the resonance frequency is, due to construction, above the highest cut-off frequency that can typically still be detected by receptors for haptic feedback and/or for tactile sensation of a person, and
wherein the frequency spectrum of the mechanical pulse at the resonance frequency excited by the actuator has no frequency components in that the power density spectrum of the mechanical pulse above the cut-off frequency is energy-free or substantially energy-free.

2. The operating unit according to claim 1, wherein the cut-off frequency is 300 Hz or 250 Hz or 200 Hz.

3. The operating unit according to claim 1, wherein the mass and/or the spring constant of the spring-mass system is/are selected for definition of its resonance frequency according to the following formula:

$$f = \frac{1}{2\pi}\sqrt{\frac{k}{m}},$$

wherein m describes the mass of the spring-mass system, k describes the spring constant of the spring-mass system and f describes the resonance frequencies.

4. The operating unit according to claim 1, wherein the operating unit has a touchpad or a touchscreen with a touch-sensitive surface.

5. The operating unit according to claim 1, wherein the operating unit is configured to detect a valid actuation as a function of the actuation pressure or actuation force or the course of the actuation pressure or actuation force.

6. The operating unit according to claim 1, wherein the actuator is designed as a tension rod magnet, as a plunger coil drive or as a piezo drive.

* * * * *